United States Patent
Nakamura et al.

(10) Patent No.: US 7,265,594 B2
(45) Date of Patent: Sep. 4, 2007

(54) METHODS AND APPARATUS FOR GENERATING TIMING SIGNALS

(75) Inventors: Katsufumi Nakamura, Andover, MA (US); David P. Foley, Chelmsford, MA (US)

(73) Assignee: Analog Devices, Inc., Norwood, MA (US)

( * ) Notice: Subject to any disclaimer, the term of this patent is extended or adjusted under 35 U.S.C. 154(b) by 731 days.

(21) Appl. No.: 10/406,125

(22) Filed: Apr. 3, 2003

(65) Prior Publication Data

US 2003/0235260 A1 Dec. 25, 2003

Related U.S. Application Data

(60) Provisional application No. 60/370,001, filed on Apr. 3, 2002.

(51) Int. Cl.
*H03B 19/00* (2006.01)
(52) U.S. Cl. .................................. 327/141; 327/158
(58) Field of Classification Search ............ 327/141, 327/105, 156–158, 181, 147–149
See application file for complete search history.

(56) References Cited

U.S. PATENT DOCUMENTS

| 5,847,588 | A | * | 12/1998 | McDermott | 327/144 |
| 5,889,436 | A | * | 3/1999 | Yeung et al. | 331/2 |
| 6,031,401 | A | | 2/2000 | Dasgupta | |
| 6,100,735 | A | * | 8/2000 | Lu | 327/158 |
| 6,690,219 | B2 | | 2/2004 | Chuang | |
| 6,791,905 | B1 | * | 9/2004 | Sekiguchi | 368/80 |
| 2003/0099321 | A1 | * | 5/2003 | Juan et al. | 375/376 |

OTHER PUBLICATIONS

Paul C. Davis, Karl R. Gardner and Alan M. Gordon, "A Fully Integrated Timing Generator for the PICTUREPHONE Video-Telephone Camera," IEEE J. Solid-State Circuits, vol. 4, No, 5, pp. 259-263, Oct. 1969, USA.

\* cited by examiner

*Primary Examiner*—Dinh T. Le
(74) *Attorney, Agent, or Firm*—Wolf, Greenfield & Sacks, P.C.

(57) ABSTRACT

One embodiment of the invention is directed to a method, comprising acts of generating a plurality of delay signals, and processing at least first and second delay signals of the plurality of delay signals to generate a first timing signal. Another embodiment of the invention is directed to a timing signal generator to generate a plurality of timing signals. The circuit comprises a delay signal generator to generate a plurality of delay signals, and a clock synthesizer to generate the timing signals based on selected ones of the delay signals.

41 Claims, 13 Drawing Sheets

METHODS AND APPARATUS FOR GENERATING TIMING SIGNALS

CROSS-REFERENCE TO RELATED APPLICATIONS

This application claims the benefit, under 35 U.S.C. §119(e), of the filing date of U.S. provisional application Ser. No. 60/370,001 entitled "Programmable Timing Generator for Charge-Coupled Device Signal Processor," filed Apr. 3, 2002 and incorporated herein by reference.

FIELD OF THE INVENTION

The present invention is related to the field of timing signal generators.

DESCRIPTION OF THE RELATED ART

Signal processing channels are used to acquire, convert, and/or process sensed signals. Such processing channels are commonly used in imaging and video applications, and other areas where signals are acquired and processed. These channels typically include a series of circuit elements, each of which performs a particular acquisition, conversion, or processing function. Hence, signal processing channels may require synchronization to one or more timing signals to ensure that the signals are sampled at the proper times by each element of the signal processing channel. Timing signals may also be used in the signal processing channel for other timing purposes.

An example of a conventional signal processing channel is illustrated in FIG. 1, where a charge coupled device (CCD) is used to acquire the signals that are processed by the channel. CCDs are used in a variety of imaging applications to convert photons into electrical charge. As shown, signal processing channel 1 includes a CCD 3, a correlated double sampler (CDS) 5, a programmable gain amplifier (PGA) 7, an analog-to-digital converter (ADC) 9, a digital image processor (DSP) 11, and a timing generator 13. Timing generator 13 generates timing signals that are provided to each circuit element (i.e., CCD 3, CDS 5, PGA 7, ADC 9, and DSP 11) of signal processing channel 1. The timing signals are generated based on a reference clock signal 15, which is input to timing generator 13.

CCD 3, which converts received photons to electrons via a two-dimensional array of photodiodes, receives timing signals H1, H2, and RG from timing generator 13. Timing signals H1 and H2 control the times at which the output of the photodiodes is transferred to an output node. Timing signal RG controls the time at which the contents of the node is reset. The analog output of CCD 3 is passed to an analog signal processor comprising CDS 5 and PGA 7. CDS 5 receives CCD output 17, and processes the output to remove the correlated noise component. To accomplish the noise reduction, CDS 5 samples CCD output 17 at two different times. The sample times are controlled by timing signals SHP and SHD. The difference between the two samples does not include the correlated noise component.

CDS output 19 is passed to PGA 7, which amplifies the analog CDS output 19. PGA output 21 is then passed to analog-to-digital converter 9, which converts the analog PGA output 21 to a digital output. Digital ADC output 23 is processed as a digital signal in DSP 11, which provides a processed digital output 25. PGA 7, ADC 9, and DSP 11, respectively receive timing signals CLKPGA, CLKADC, and CLKDSP from timing generator 13. Timing signals CLKPGA, CLKADC, and CLKDSP control the time at which the CDS output 19, PGA output 21, and ADC output 23 are respectively sampled by PGA 7, ADC 9, and DSP 11.

FIG. 2 illustrates an implementation of the timing generator 13 of FIG. 1 according to the prior art. A reference clock signal 27 is input to conventional timing generator 29, which outputs a plurality of output clock signals CLK1-CLKM. Timing generator 29 includes a sequential logic circuit 31a-n for each of the output clock signals CLK1-CLKM output by timing generator 29. Each sequential logic circuit 31a-n receives reference clock signal 27 as an input, which may synchronize or trigger the sequential logic. Sequential logic is a form of binary circuit design that employs one or more inputs and one or more outputs, whose states are related by defined rules that depend, in part, on previous states. Hence, sequential logic circuits 31a-n may contain memory elements. Common examples of a circuits employing sequential logic are flip-flops, counters, and state machines.

As a result of being output by sequential logic circuits 31a-n, output clock signals CLK1-CLKM are limited to those signals that include edges at either the rising or falling edges of reference clock signal 27. Hence, the resolution of output clock signals CLK1-CLKM is limited by the frequency of reference clock signal 27, which must have a greater frequency than the desired output clock signals. For example, to achieve a resolution of 10 ns, a 100 MHz reference clock signal is required. To achieve sub-nanosecond resolutions, the reference clock must be greater than 1 GHz. It can be difficult and expensive to provide a reference clock that generates a frequency high enough to attain the desired resolution of the output clock signals. Further, a high frequency reference clock adds noise and increases power dissipation in the signal processing channel.

In view of the foregoing, a need exists for a timing generator, such as for use in a signal processing channel, that generates highly accurate signals without the need for a high frequency reference clock.

SUMMARY OF THE INVENTION

One embodiment of the invention is directed to a method, comprising acts of generating a plurality of delay signals, and processing at least first and second delay signals of the plurality of delay signals to generate a first timing signal.

Another embodiment of the invention is directed to a timing signal generator to generate a plurality of timing signals. The circuit comprises a delay signal generator to generate a plurality of delay signals, and a clock synthesizer to generate the timing signals based on selected ones of the delay signals.

DETAILED DESCRIPTION OF THE INVENTION

One aspect of the invention is directed to a programmable timing generator comprising an external interface to allow the timing signals generated by the timing generator to be controlled, and a method of using the same. The timing generator may include a reference clock that has a frequency that is the same as or less than the frequency of the generated timing signals, thereby eliminating the need for a high frequency reference clock. The signal generated by the reference clock may be delayed to form a number of delay signals, each delayed by a fraction of one period of the reference clock signal. The delay signals may be processed to form the timing signals that are output from the timing generator. Various embodiments of a timing generator for use in a signal processing channel will be described below in connection with FIGS. 3-10.

Another aspect of the invention is directed to a programmable clock synthesizer of a clock generator, wherein the programmable clock synthesizer processes delay signals and generates timing signals based on the delay signals. In one example, a first delay signal is used to control the rising edges of a timing signal, and another delay signal is used to control the falling edges of the timing signal. The delay signals used to control the timing signal may be selected via a user interface, so that the timing signals provided to the signal processing channel may be independently adjustable. Various embodiments of a programmable clock synthesizer for use in a timing generator will be described below in connection with FIGS. 11-13.

Figure 1:
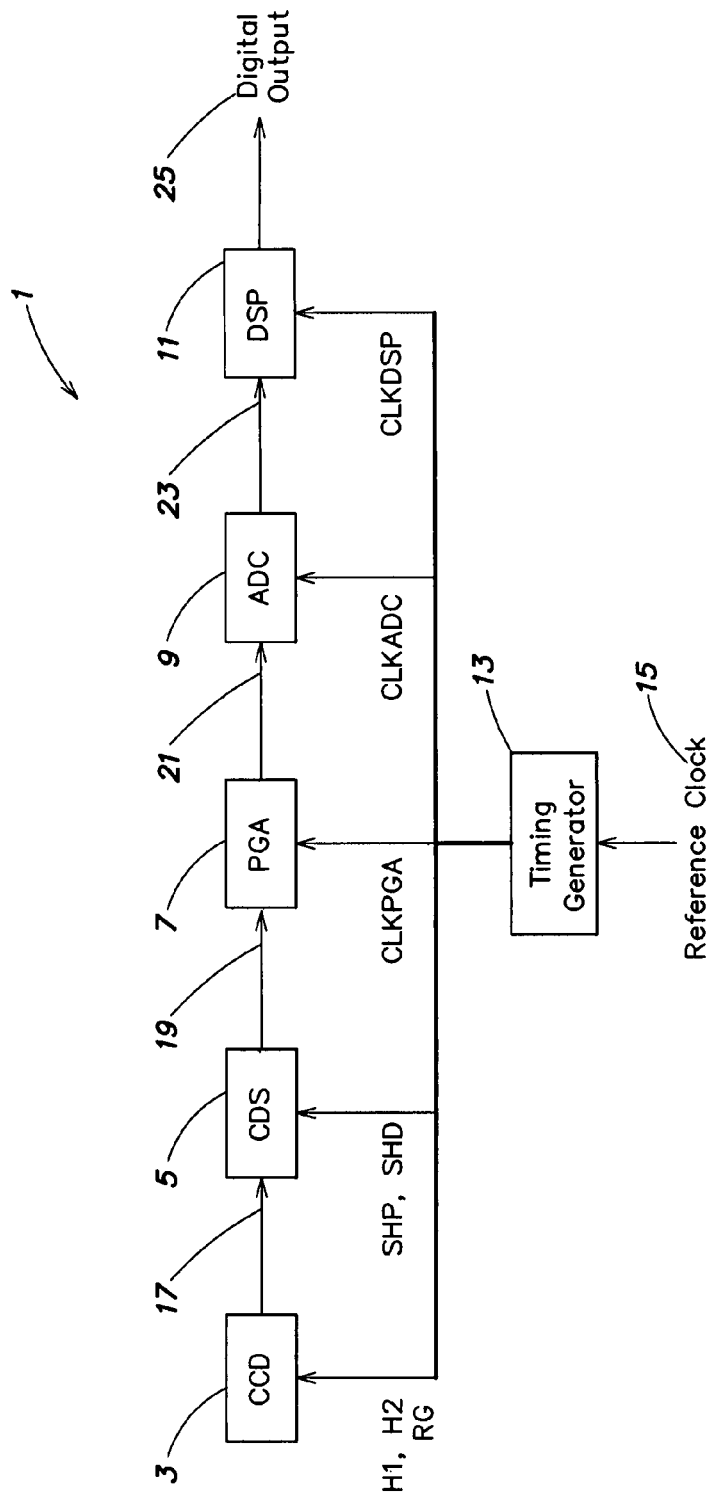
FIG. 1 is a block diagram of a signal processing channel having a conventional timing generator.
Figure 2:
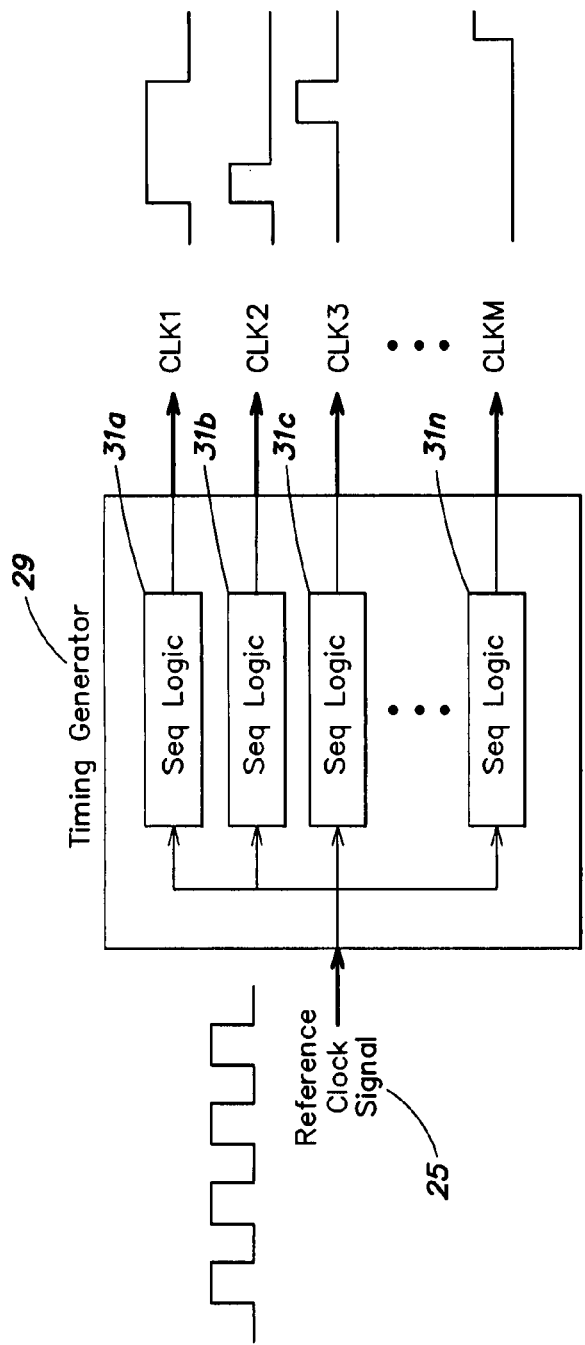
FIG. 2 is a block diagram of a conventional timing generator.
Figure 3:
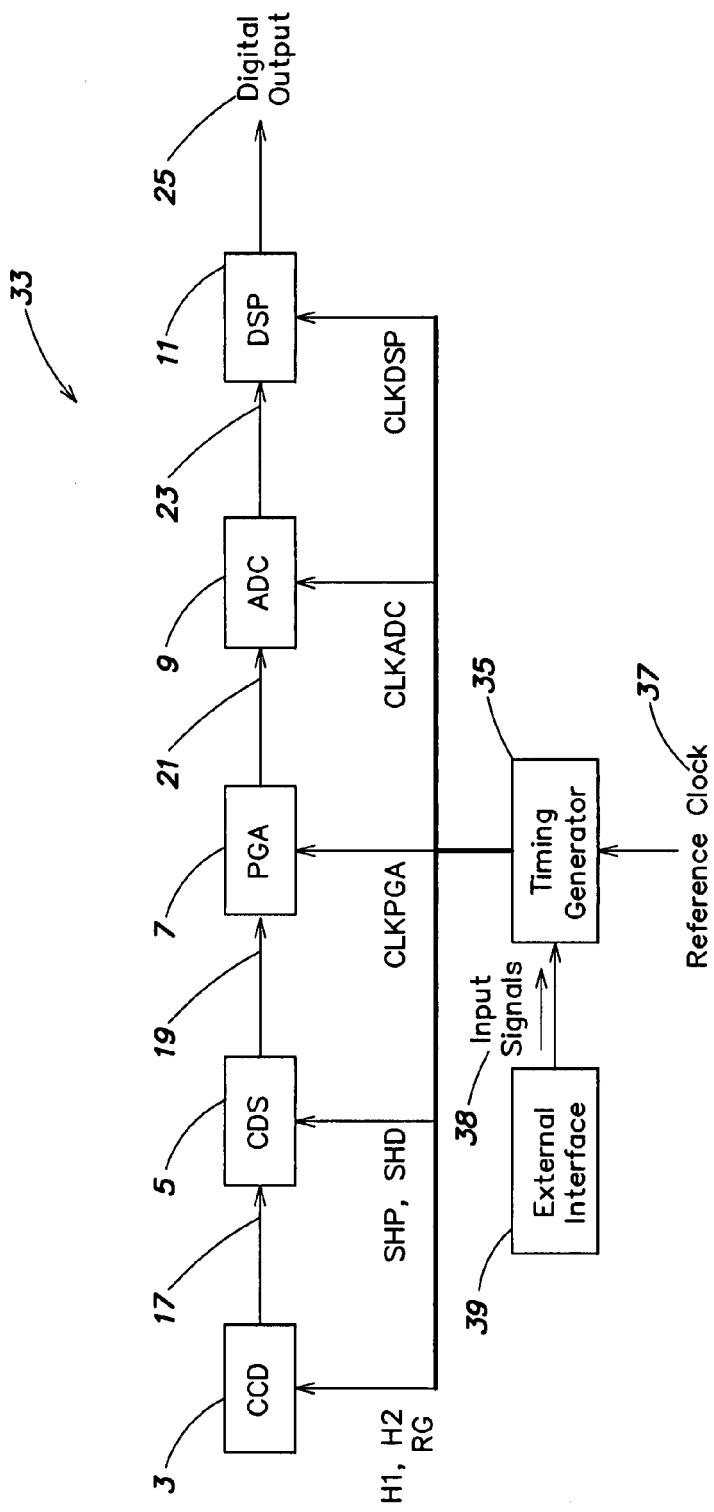
FIG. 3 is a block diagram of a signal processing channel having a timing generator in accordance with one embodiment of the invention.

FIG. 3 illustrates a modified version the signal processing channel 1 of FIG. 1. Signal processing channel 33 includes a timing generator 35 that may receive one or more input signals 38 from an external interface 39. Input signals 38 may be used to control the timing signals generated by timing generator 35, such as timing signals H1, H2, RG in the example of FIG. 1. It should be appreciated, however, that timing generator 35 need not be coupled to an external interface 39 and/or receive input signals to control the generated timing signals in accordance with embodiments of the invention. In one example, timing generator 35 may be integrated onto a chip that includes the other components of the signal processing channel, such as CCD 3, CDS 5, PGA 7, ADC 9, and DSP 11.

It should also be appreciated that, although timing generator 35 is shown in a signal processing channel 33 that includes a CCD 3 to acquire the signals that are processed by the channel, the invention is not limited in this respect. Other types of signal acquisition devices may alternatively be used, including those used in imaging, video, and other signal processing applications.

Figure 4:
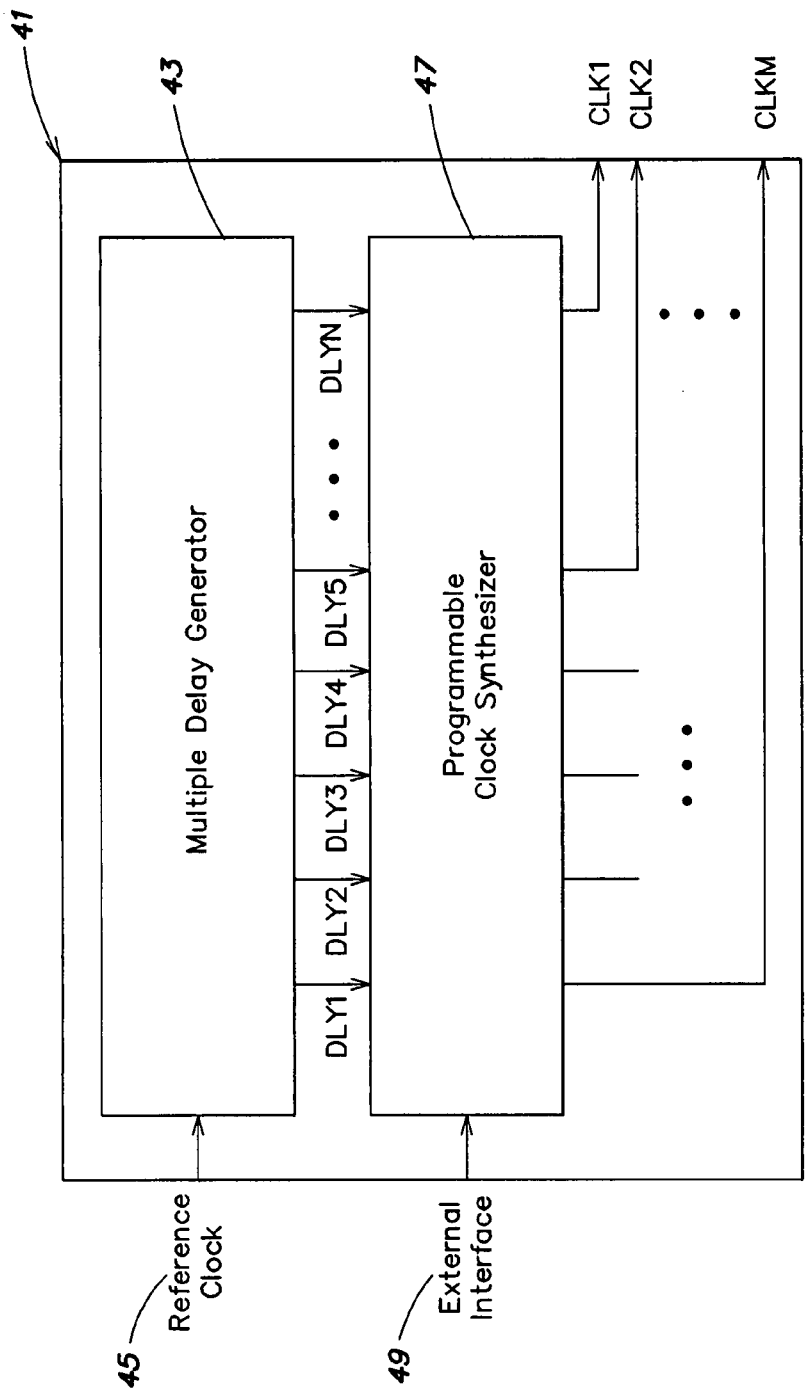
FIG. 4 illustrates one implementation of the timing generator shown in of FIG. 3.

FIG. 4 illustrates an exemplary implementation of the timing generator 35 of FIG. 3 according to one embodiment of the invention. Timing generator 41 includes a multiple delay generator 43 that receives, as an input, a reference clock signal 45. Multiple delay generator 43 outputs a plurality of delay signals DLY1-DLYN. Each of delay signals DLY1-DLYN may have the same period and duty cycle as reference clock signal 45, but a phase that is delayed with respect to the reference clock signal. Exemplary implementations of multiple delay generator 43 will be discussed in connection with FIGS. 5-10.

Delay signals DLY1-DLYN are input to a programmable clock synthesizer 47, which processes the delay signals to generate output clock signals CLK1-CLKM. According to one embodiment of the invention, delay signals to be processed may be selected using an external interface 49. Output clock signals CLK1-CLKM may have rising and/or falling edges that correlate with rising and/or falling edges of selected delay signals DLY1-DLYN. Further, output clock signals CLK1-CLKM may correspond to one or more of the timing signals H1, H2, RG, SHP, SHD, CLKPGA, CLKADC, and CLKDSP of FIG. 3. Exemplary implementations of programmable clock synthesizer 47 will be discussed in connection with FIGS. 11-13.

Figure 5:
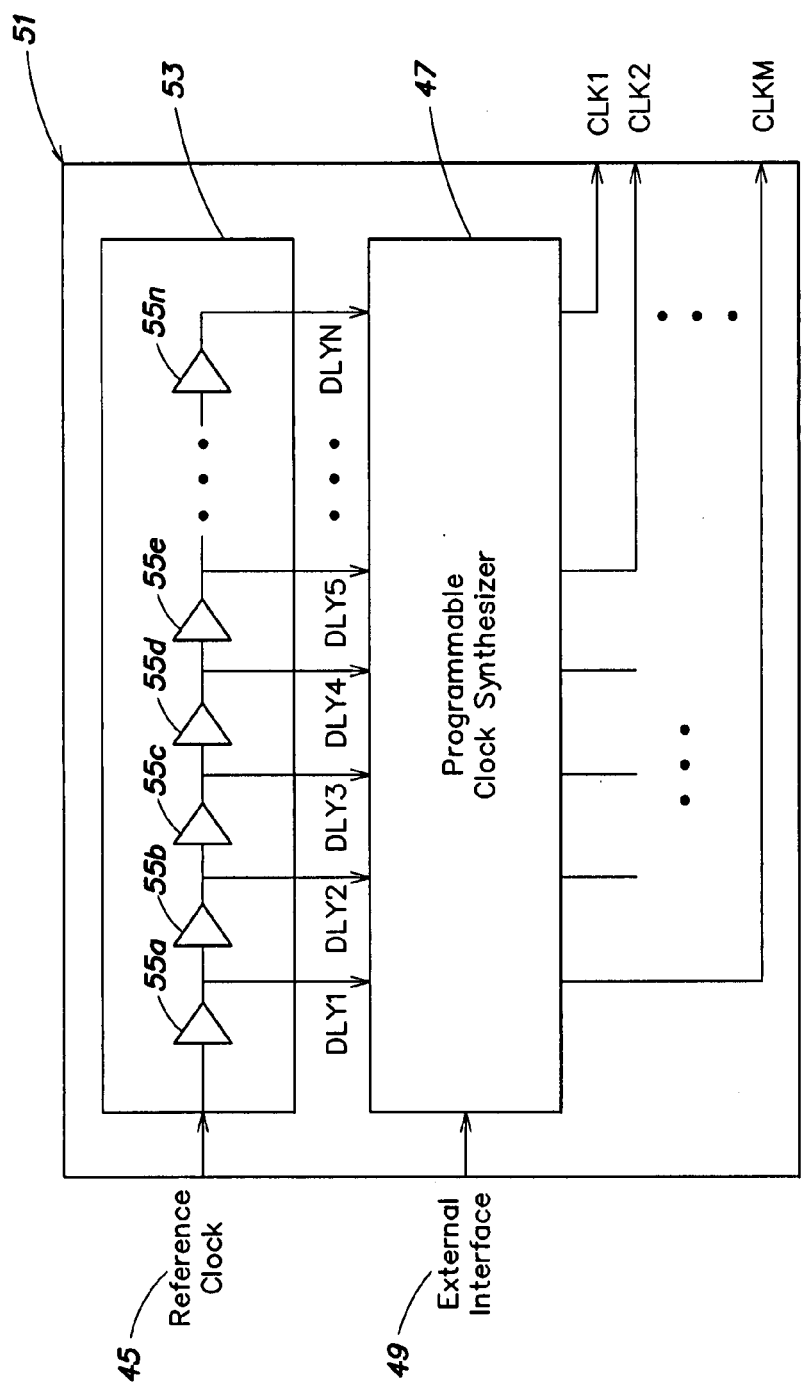
FIG. 5 illustrates one implementation of the timing generator shown in FIG. 4.

FIG. 5 illustrates a first exemplary implementation of the timing generator 41 of FIG. 4. Timing generator 51 includes a multiple delay generator 53 and programmable clock synthesizer 47. Multiple delay generator 53 does not use feedback, and thus may be considered an open-loop control system. Multiple delay generator 53 includes delay elements 55a-n, each of which generates a phase delay in a signal input to the delay element. Reference clock signal 45 is input to the first delay element 55a, which generates a delay signal DLY1 that has a delayed phase with respect to the reference clock signal. Delay signals DLY1-DLY4 are input to the delay elements 55b-e, which generate delay signals DLY2-DLY5, respectively, which have a delayed phase with respect to the input delay signals.

According to one example, each of delay elements 55a-n generates approximately the same phase delay, such that each of delay signals DLY2-DLYN has a phase delay that is a multiple of the phase delay of delay signal DLY1. However, the invention is not limited in this respect, and delay elements 55a-n may alternatively generate differing phase delays, such that the phase delay of each of delay signals DLY2-DLYN is not a multiple of the phase delay of delay signal DLY1.

Figure 6:
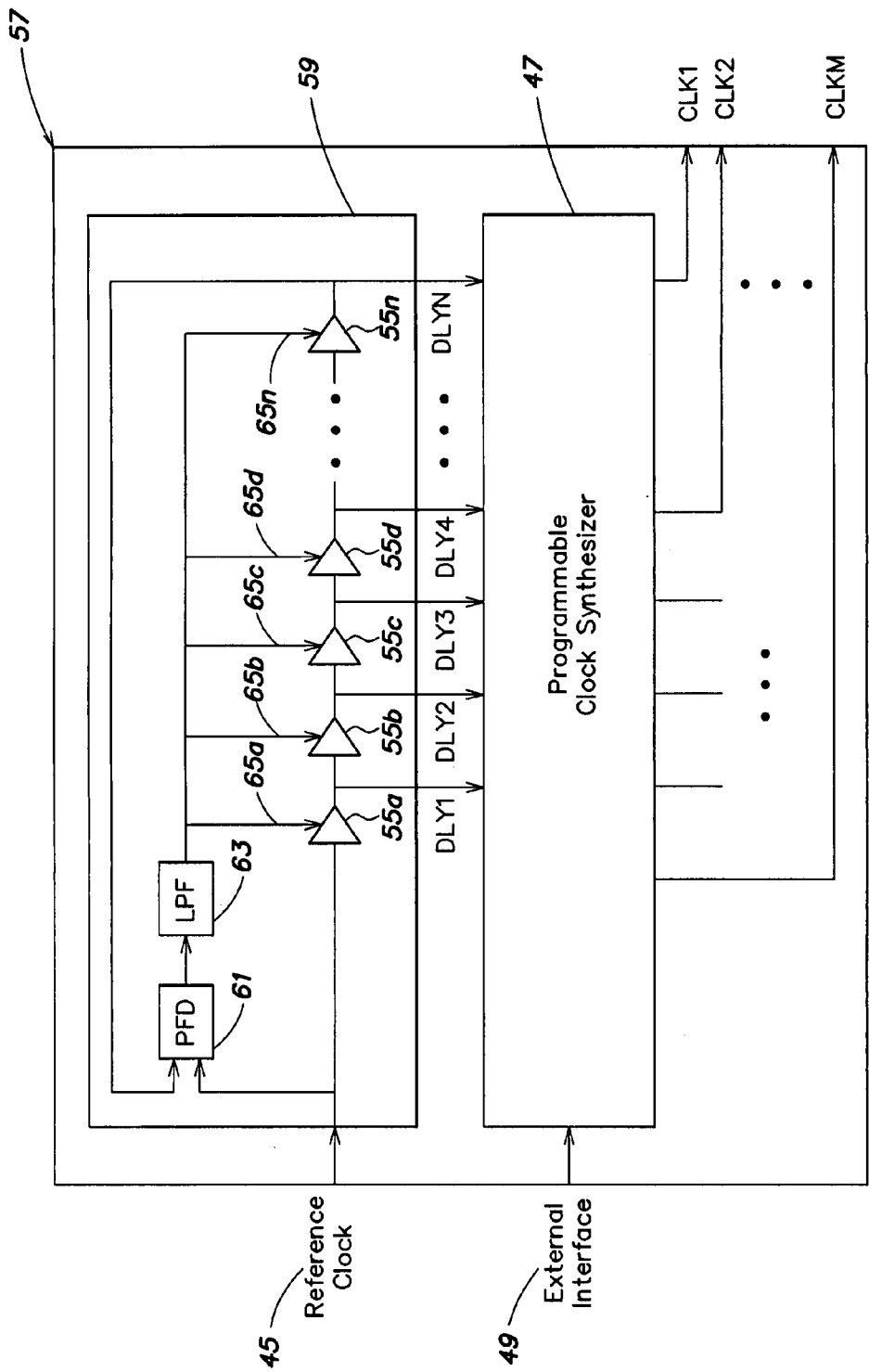
FIG. 6 illustrates another implementation of the timing generator shown in FIG. 4.

FIG. 6 illustrates a second exemplary implementation of the timing generator 41 of FIG. 4. Timing generator 57 includes a multiple delay generator 59, and programmable clock synthesizer 47. Multiple delay generator 59 uses feedback to control the delay of each of delay elements 55a-n, and accordingly may be considered a closed-loop control system. In particular, multiple delay generator 59 includes a negative feedback loop to lock the total delay of delay elements 55a-n, such that delay signal DLYN is approximately equal to one period of reference clock signal 45. The feedback loop may increase the stability of the delay of each delay element 55a-n over environmental variations, such as variations in temperature and supply voltage.

Multiple delay generator 59 includes a phase frequency detector 61 and a low pass filter (LPF) 63. Phase frequency detector 61 receives, as inputs, the output of delay element 55n and reference clock signal 45, which is also input to delay element 55a. The phase frequency detector compares the phase of these two inputs, and outputs voltage pulses that indicate a phase difference between the output of delay element 55n and reference clock signal 45. The sign of the phase difference may determine whether the voltage pulses are negative or positive. LPF 63 integrates the voltage pulses and generates a control signal that is transmitted to each of delay elements 55a-n via control lines 65a-n. It should be appreciated that while control lines 65a-n are illustrated separately, control lines 65a-n may represent a single node of multiple delay generator 59 and may carry the same signal or signals.

The control signal causes the delay generated by each of delay elements 55a-n to increase or decrease by an amount proportional to the phase difference determined by phase frequency detector 61. In turn, the output of delay element 55n, which represents the total delay of the sequence of delay elements 55a-n, is increased or decreased to closer approximate one period of reference clock signal 45. The feedback loop settles when the phase of the output of delay element 55n and reference clock signal 45 are synchronized to a desired degree.

Multiple delay generator 59 includes delay elements 55a-n, each of which generates a phase delay in a signal input to the delay element. Reference clock signal 45 is input to the first delay element 55a, which generates a delay signal DLY1 that has a delayed phase with respect to the reference clock signal. Delay signals DLY1-DLY3 are input to the delay elements 55b-d, which generate delay signals DLY2-DLY4, respectively, that have a delayed phase with respect to the input delay signals.

In the example described above, delay signal DLYN has a phase delay with respect to reference clock signal 45 that approximates 360°. However, it should be appreciated that the invention is not limited in this respect and that delay elements 55a-n may have a total delay that is greater than or less than one period, causing a phase shift with respect to the reference clock that is greater than or less than 360°. Further, each of the delay elements may have a delay that approximates the delay of the other delay elements, or may have a different delay.

Figure 7:
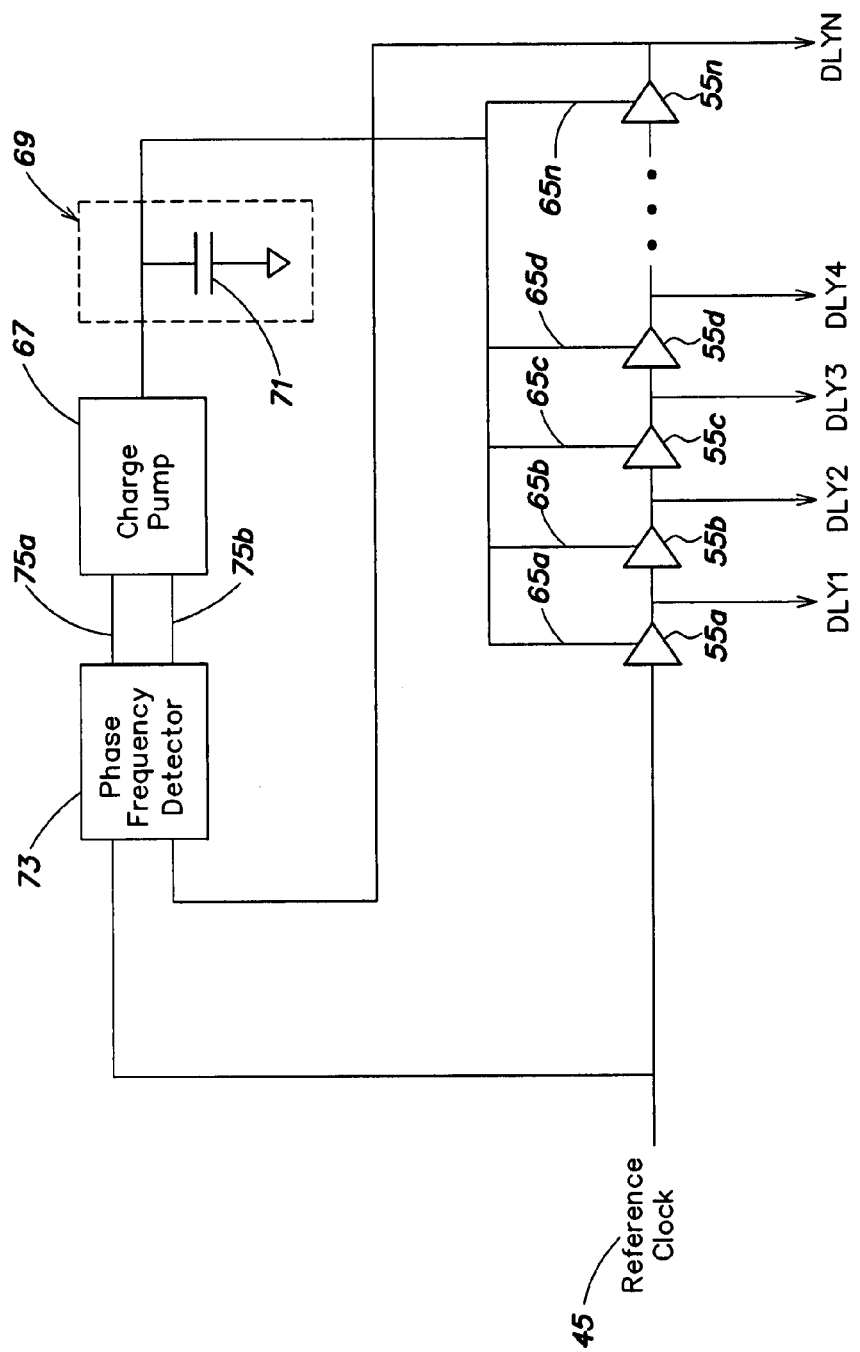
FIG. 7 illustrates one implementation of the multiple delay generator shown in FIG. 6.

FIG. 7 illustrates one possible implementation of the multiple delay generator 59 of FIG. 6. In FIG. 7, the LPF 63 of FIG. 6 is implemented using a charge pump 67 and a loop filter 69. As in FIG. 6, phase frequency detector (PFD) 73 receives, as inputs, the output of delay element 55n and reference clock signal 45, which is also input to delay element 55a. Phase frequency detector 73 then compares the phase of these two inputs, and outputs a signal proportional to the difference. If the output of delay element 55n lags the phase of reference clock signal 45, voltage pulses indicative of the phase difference are output from phase frequency detector on a first output 75a. Conversely, if the output of delay element 55n leads the phase of reference clock signal 45, voltage pulses indicative of the phase difference are output from phase frequency detector on a second output 75b. The first and second outputs are coupled to charge pump 67. Charge pump 67 converts the voltage pulses of phase frequency detector 73 into current pulses, and these are in turn integrated by a loop filter 69. In FIG. 7, loop filter 69 is implemented as a capacitor 71 coupled to ground, however many other alternative implementations of loop filter 69 are possible.

As in FIG. 6, the output of loop filter 69 is transmitted to each of delay elements 55a-n via control lines 65a-n. The control signal output by loop filter 69 causes the delay generated by each of delay elements 55a-n to increase or decrease by an amount proportional to the phase difference determined by phase frequency detector 73. In turn, the output of delay element 55n, which represents the total delay of the sequence of delay elements 55a-n, is increased or decreased to closer approximate one period of reference clock signal 45. The feedback loop settles when the phase of the output of delay element 55n and reference clock signal 45 are synchronized to a desired degree.

It should be appreciated that a number of variations are possible in the multiple delay generator of FIG. 7. For example, any circuit capable of comparing two phases and generating one or more signals indicative of the difference may be sufficient for frequency detector 73, and the invention is not limited to the particular phase frequency detector 73 described. Further, the one or more signals generated by phase frequency detector 73 to indicate to difference need not be voltage pulses, and may alternatively be current pulses or a periodic wave, for example. A number of types of low pass filters, such as those are well-known in the art, and may be suited for use as LPF 63 in the circuit of FIG. 6.

Figure 8:
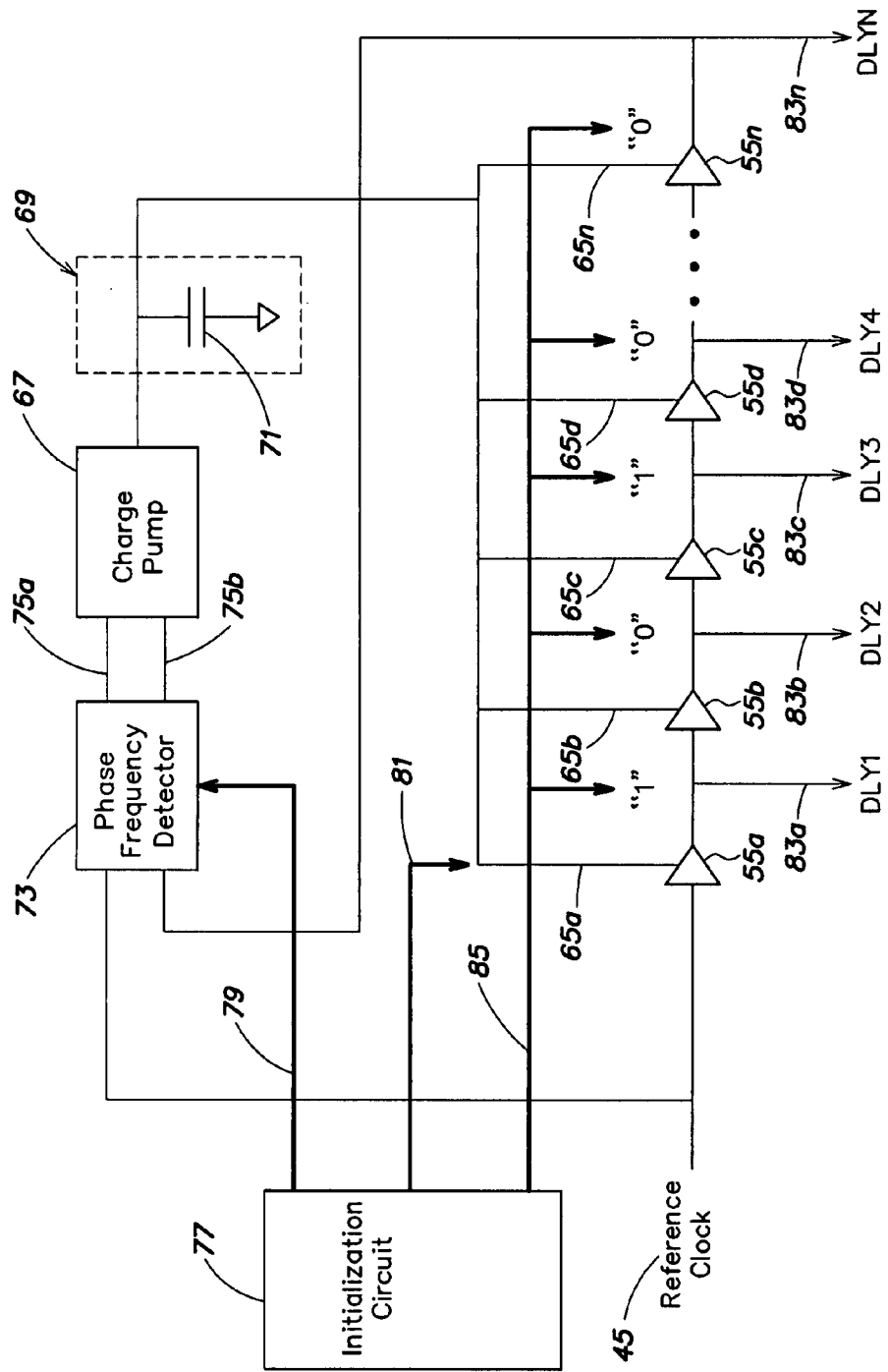
FIG. 8 illustrates a modified version of the multiple delay generator shown in FIG. 7.

FIG. 8 illustrates the multiple delay generator of FIG. 7, further including an initialization circuit to initialize the feedback loop. Initialization may be performed to ensure that the series of delay elements 55a-n settles to a desired delay. Initialization circuit 77, shown in FIG. 8, may perform any one or more of three initialization functions.

According to the first function, initialization circuit 77 initializes the phase difference between reference clock signal 45 and the output of delay element 55n to a known value using an auxiliary input 79 to phase frequency detector 73. In one implementation of the first function, the phase frequency detector is triggered to generate voltage pulses indicative of a phase difference on first output 75a, such that charge pump 67 and loop filter 69 generate a control signal causing an increased delay in delay elements 55a-n. In another implementation of the first function, the phase frequency detector is triggered to generate voltage pulses indicative of a phase difference on second output 75b, such that charge pump 67 and loop filter 69 generate a control signal causing a decreased delay in delay elements 55a-n. In yet another implementation, the phase frequency detector is initialized to a phase difference of zero.

According to the second function, initialization circuit 77 initializes control lines 65a-n by providing an initialization control signal on control lines 65a-n that produces an approximate minimum delay or an approximate maximum delay of delay elements 55a-n. In one example, initialization circuit 77 generates the initialization control signal, and transmits the signal to control lines 65a-n using an auxiliary input 81 to the control lines 65a-n.

According to the third function, initialization circuit 77 initializes a state of each of tap lines 83a-n, which are present at the output of each of delay elements 55a-n, respectively. The state of tap lines 83a-n may be initialized via an initialization line 85 coupled to initialization circuit 77. In one example, tap lines 83a-n are initialized to an alternating pattern of "1's" and "0's," as shown in FIG. 8. This pattern produces multiple positive edge transitions at the input of the phase frequency detector 73 that receives the output of delay element 55n. The multiple positive edge transitions initialize phase frequency detector 73 in a state that corresponds to increasing the delay of the delay line, regardless of the phase of the reference clock and state of the phase detector. Thus, phase frequency detector 73 is triggered to generate voltage pulses indicative of a phase difference on first output 75a, such that charge pump 67 and loop filter 69 generate a control signal causing an increased delay in delay elements 55a-n. It should be appreciated that a similar result may be achieved using a sequence of "1's" and "0's" different from that shown in FIG. 8. For example, the pattern of "1's" and "0's" may be inverted, or the pattern may alternate non-sequentially.

Although one example of an initialization circuit and process is described in connection with FIG. 8, it should be appreciated that other initialization circuits and processes may be used in accordance with the invention and that, alternatively, no initialization circuit or process may be used. In addition, any combination of the above processes may be used, and such processes may be implemented using a single circuit, multiple circuits, or other means.

Figure 9:
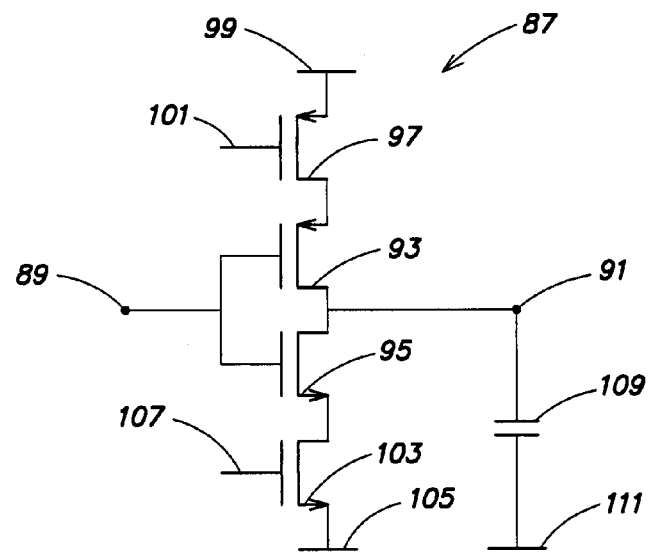
FIG. 9 illustrates one implementation of a delay cell, such as one or more of the delay cells shown in any of FIGS. 5-8.

FIG. 9 illustrates one exemplary implementation of a delay cell, such as delay cells 55a-n illustrated in FIGS. 5-8. Delay cell 87 includes an input node 89 and an output node 91, which respectively represent the input and output of the delay cell. Input node 89 is coupled to the gate terminals of a first p-type MOS transistor 93 and a first n-type MOS transistor 95. Output node 91 is coupled to the drain terminals of first p-type MOS transistor 93 and first n-type MOS transistor 95. The source terminal of first p-type MOS transistor 93 is coupled to the drain terminal of a second p-type MOS transistor 97. The source terminal of second p-type MOS transistor 93 is coupled to a first supply voltage 99 of delay cell 87, and the gate terminal of second p-type MOS transistor 93 is coupled to a first bias voltage 101 of the delay cell. The source terminal of first n-type MOS transistor 95 is coupled to the drain terminal of a second n-type MOS transistor 103. The source terminal of second n-type MOS transistor 103 is coupled to a second supply voltage 105 of delay cell 87, and the gate terminal of second n-type MOS transistor 103 is coupled to a second bias voltage 107 of the delay cell. A capacitor 109 is coupled between output node 91 and a third supply voltage 111, which may be equivalent to second supply voltage 105.

Figure 10:
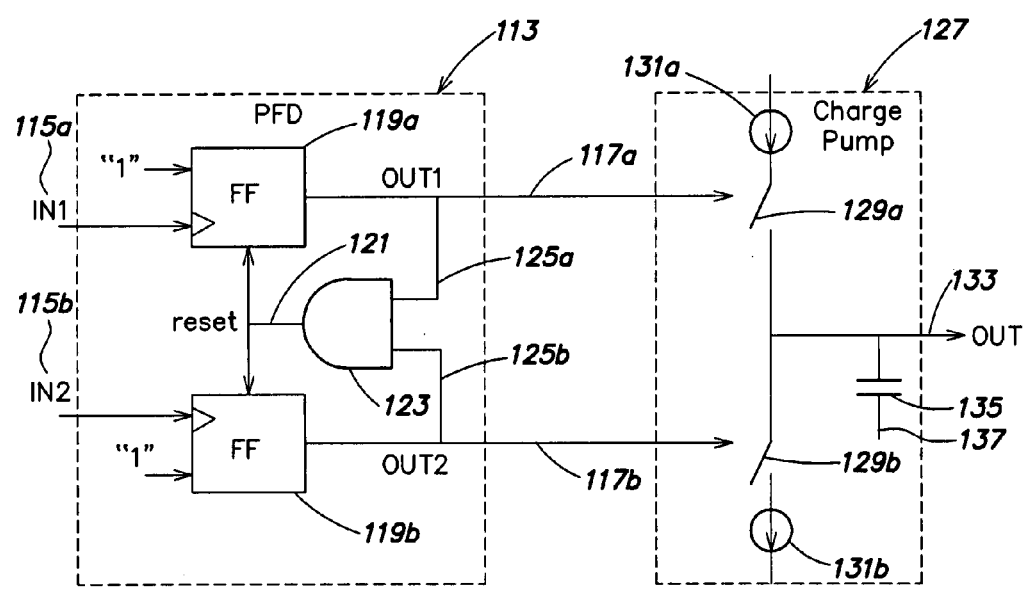
FIG. 10 illustrates one implementation of a phase frequency detector and charge pump, such as the phase frequency detector and charge pump shown in FIGS. 7-8.

FIG. 10 illustrates one exemplary implementation of the phase frequency detector 73 and the charge pump 67 illustrated in FIGS. 7-8. Phase frequency detector 113 includes first and second inputs 115a and 115b and first and second outputs 117a and 117b. First and second inputs 115a and 115b are coupled to the clock inputs of first and second flip-flops 119a and 119b, respectively. First and second flip-flops 119a and 119b are set-reset flip-flops, having set inputs coupled to a high input voltage and reset inputs coupled to an output 121 of an AND gate 123. First and second inputs 125a and 125b are coupled to the outputs of flip-flop 119a and 119b, which represent the outputs 117a and 117b of phase frequency detector 113.

Charge pump 127 includes first and second current sources 131a and 131b that are coupled to output node 133 via switches 129a and 129b, respectively. Switches 129a and 129b are respectively controlled by outputs 117a and 117b of phase frequency detector 113. Charge pump 127 also includes a capacitor 135 coupled to output node 133, and a reference voltage 137, such as ground.

Various embodiments of the multiple delay generator 43 of timing generator 41 (FIG. 4) were discussed in connection with FIGS. 5-10. Various embodiments of the programmable clock synthesizer 47 of timing generator 41 will be now be described in connection with FIGS. 11-13. As shown in FIG. 4, programmable clock synthesizer 47 may generate one or more timing signals CLK1-CLKM using one or more delay signals DLY1-DLYN. Optionally, an external interface such as the external interface 49 of FIG. 4 may be used to provide signals that control or affect the processing of one or more of delay signals DLY1-DLYN.

Figure 11A:
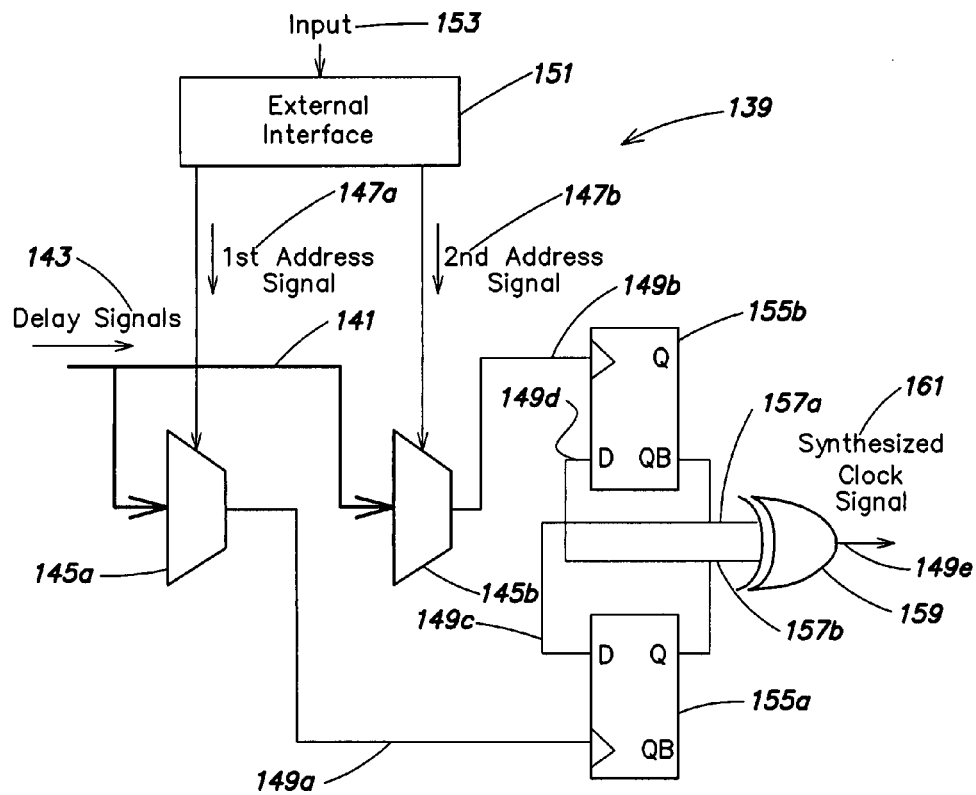
FIG. 11A illustrates a schematic representation of one implementation of the programmable clock synthesizer of FIG. 4.

FIG. 11A illustrates one embodiment of a programmable clock synthesizer that may be used in a timing generator such as the timing generator 41 of FIG. 4. In the embodiment of FIG. 11A, multiplexers are used to select first and second delay signals that are used to generate a synthesized clock signal. In the example shown, the first delay signal is used to control the timing of the rising edges of the synthesized clock signal, and the second delay signal is used to control the timing of the falling edges of the synthesized clock signal. However, numerous variations are possible. For example, the programmable clock synthesizer may alternatively be constructed so that the first delay signal controls the timing of alternate rising edges and the second delay signal controls the timing of alternate falling edges of the synthesized clock signal. Third and fourth delay signals could be used to control the remaining edges of the synthesized clock signal.

Programmable clock synthesizer 139 includes an input bus 141 that transmits two or more delay signals 143, such as delay signals DLY1-DLYN shown in FIG. 3. Input bus 141 is coupled to first and second multiplexers 145a and 145b, which receive the two or more delay signals 143 as inputs. First multiplexer 145a is responsive to a first address signal 147a that selects one of delay signals 143 to be output from the first multiplexer. Similarly, second multiplexer 145b is responsive to a second address signal 147b that selects one of delay signals 143 to be output from the second multiplexer. The delay signal selected by the first address signal 147a and output by the first multiplexer 145a will appear at node 149a, and the delay signal selected by the second address signal 147b and output by the second multiplexer 145b will appear at node 149b. It should be appreciated that alternative circuitry may be used for selecting first and second address signals 147a and 147b, and that the invention is not limited in this respect. For example, a single multiplexer with outputs for each of first and second address signals 147a and 147b may alternatively be used.

An external interface 151 may be used to select the first and second address signals 147a and 147b. For example, external interface 151 may accept one or more inputs 153 corresponding to first and second address signals 147a and 147b. A number of implementations are possible to allow for selection of first address signal 147a and/or second address signal 147b. In one example, external interface 151 may be implemented in hardware that is controlled by a human operator (e.g., using switches). In another example, external interface 151 may be implemented in both software and hardware, and controlled by a human operator and/or by software code. However, it should be appreciated that external interface 151 may have a number of possible implementations, and may include any combination of hardware, software, firmware, and/or mechanical structures that enables the selection of address signals. In one example, external interface 151 is a computer system, such as a personal computer, microprocessor, or workstation.

The output of the first multiplexer 145a is coupled to the clock input of a first flip-flop 155a, and the output of the second multiplexer 145b is coupled to the clock input of a second flip-flop 155b. In the example of FIG. 11A, flip-flops 155a and 155b are D-type flip-flops that are rising edge-triggered. However, the programmable clock synthesizer may be adapted to use another type of edge-triggered flip-flop, such as a falling edge-triggered flip-flop. In addition, the programmable clock synthesizer may be adapted to substitute one or more of the D-type flip-flops for flip-flops of another type, such as J-K type flip-flops. The D inputs of first and second flip-flops 155a and 155b are respectively coupled to first and second inputs 157a and 157b of exclusive or (XOR) gate 159 at nodes 149c and 149d. In addition, the inverted output QB of first flip-flop is coupled to the first input 157a of XOR gate 159, and the non-inverted output Q of second flip-flop is coupled to the second input 157b of XOR gate 159. It should be appreciated that XOR gate 159 may be substituted for equivalent logic circuitry, or another circuit that produces a positive output when the inputs are unequal. Synthesized clock signal 161 is output from XOR gate 159 at node 149e.

In the example of FIG. 11A, the location of the rising edges of synthesized clock signal 161 are controlled by the rising edges of the delay signal selected by first multiplexer 145a, and the location of the falling edges of synthesized clock signal 161 are controlled by the rising edges of the delay signal selected by second multiplexer 145b.

However, it should be appreciated that the location of the edges of synthesized clock signal 161 may alternatively be controlled by the falling edges of the selected delay signals. Each of first and second flip-flops 155a and 155b is triggered by a rising edge of a delay signal at its clock input. Hence, each time a rising edge of the delay signal selected by first multiplexer 145a reaches the clock input of first flip-flop 155a, it causes the first flip-flop to change state. Similarly, each time a rising edge of the delay signal selected by second multiplexer 145b reaches the clock input of second flip-flop 155b, it causes the second flip-flop to change state. In turn, each change of state of inverted output QB of first flip-flop 155a triggers a rising edge in synthesized clock signal 161. Each change of state of non-inverted output Q of second flip-flop 155b triggers a falling edge in synthesized clock signal 161.

Figure 11B:
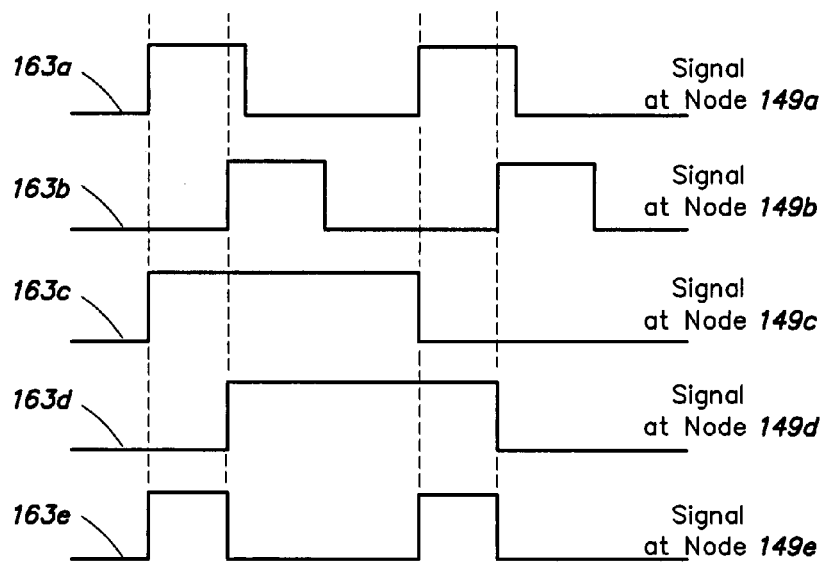
FIG. 11B illustrates a timing diagram for the programmable clock synthesizer of FIG. 11A for one combination of delay signals selected by the programmable clock synthesizer.

FIG. 11B illustrates the signals at nodes 149a-e for one combination of delay signals that may be output by first and second multiplexers 145a and 145b. Specifically, delay signal 163a represents the signal output by first multiplexer 145a at node 149a, and delay signal 163b represents the signal output by second multiplexer 145b at node 149b. Of course, it should be appreciated that delay signals 149a and 149b represent just one possible combination of delay signals that may be output by first and second multiplexers 145a and 145b and that many other delay signals and combinations thereof are possible. Signal 163c represents the signal output by the inverted output QB of second flip-flop 155b at node 149c, and input to the D input of first flip-flop 155a. As shown, signal 163c changes state at the rising edges of signal 163a. Signal 163d represents the signal output by the non-inverted output Q of first flip-flop 155a at node 149d, and input to the D input of second flip-flop 155b. As shown, signal 163d changes state at the rising edges of signal 163b. Signal 163e represents the synthesized clock output generated from delay signals 163a and 163b at node 149e. Signal 149e is high when signals 149c and 149d are unequal. As may be appreciated from FIG. 11B, rising edges of signal 149e are triggered by rising edges of delay signal 149a, and falling edges of signal 149e are triggered by rising edges of delay signal 149b.

Although a single synthesized clock signal output is shown in FIG. 11A, it should be appreciated that the programmable clock synthesizer shown may be modified to include a plurality of synthesized clock signal outputs, such that different synthesized clock signals may be generated in parallel. In one example, the programmable clock synthesizer shown may be modified by including more than one of the circuit shown in FIG. 11A, each circuit being coupled to input bus 141 and generating a synthesized clock signal output.

The use of first and second flip-flops 155a and 155b in programmable clock synthesizer 139 may, in some circumstances, cause synthesized clock signal 161 to exhibit a sub-harmonic error. The error results from the different paths in programmable clock synthesizer 139 may be used to effect the same transition of synthesized clock signal 161. For example, flip-flops 155a and 155b may output signals to inputs 157b and 157a of XOR 159 in any of four combinations: input 157a may be high and input 157b may be low, input 157a may be low and input 157b may be high, both input 157a and input 157b may be high, and both input 157a and input 157b may be low. Since the circuit pathways that effect these four states may differ, and may have different delays associated therewith, a sub-harmonic error may result in synthesized clock signal 161. To avoid possible sub-harmonic error in the synthesized clock signal, programmable clock synthesizer may be constructed without using two flip-flops or an XOR gate. One example of such a construction is described in connection with FIGS. 12A-B.

Figure 12A:
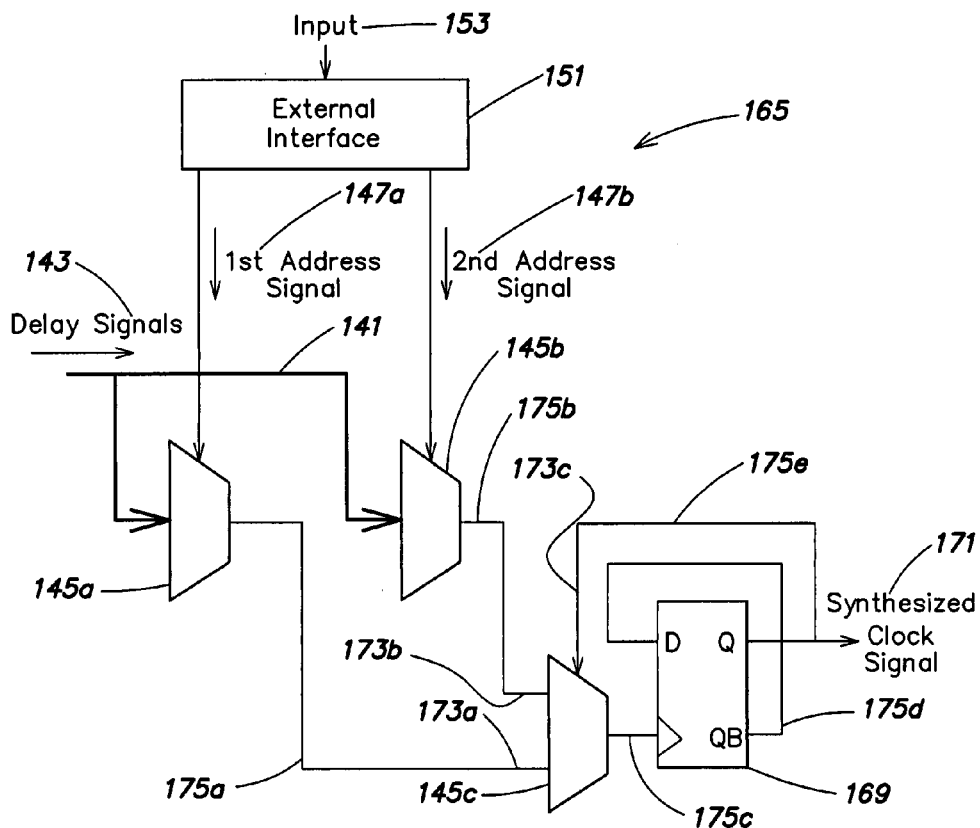
FIG. 12A illustrates a schematic representation of another implementation of the programmable clock synthesizer of FIG. 4.

FIG. 12A illustrates another embodiment of a programmable clock synthesizer that may be used in a timing generator such as the timing generator 35 of FIG. 3. As in the embodiment of FIG. 11A, multiplexers are used to select first and second delay signals that are used to generate a synthesized clock signal. The first delay signal is used to control the timing of the rising edges of the synthesized clock signal, and the second delay signal is used to control the timing of the falling edges of the synthesized clock signal.

Programmable clock synthesizer 165 includes first, second, and third multiplexers 145a, 145b, and 145c and a single flip-flop 169 that outputs synthesized clock signal 171. The portion of programmable clock synthesizer 165 including external interface 151 and first and second multiplexers 145a and 145b, which output first and second delay signals, is the same as described above in connection with FIG. 11A. The output of first multiplexer 145a is coupled to a first input 173a of third multiplexer 145c at node 175a. The output of second multiplexer 145b is coupled to a second input 173b of third multiplexer 145c at node 175b. The output of third multiplexer 145c at node 175c is coupled to the clock input of flip-flop 169. The non-inverted output Q of flip-flop 169 is coupled to a third input 173c of third multiplexer 145c to provide control of the third multiplexer. In particular, the state of the non-inverted output Q of flip-flop 169 controls which of the delay signal at node 175a and the delay signal at node 175b will be passed to the output of third multiplexer at node 175c. For example, a high signal at third input 173c of third multiplexer 145c causes the signal at second input 175b to pass to the output of third multiplexer at node 175c. A low signal at third input 173c of third multiplexer 145c causes the signal at first input 175a to pass to the output of third multiplexer at node 175c. The signal at node 175c, which is input to the clock of flip-flop 169 controls the non-inverted output Q of the flip-flop, and hence the synthesized clock signal 171. In particular, a rising edge at node 175c causes the non-inverted output Q to become the opposite of the D input of the flip-flop, which is coupled to the inverted output QB at node 175d.

In the example of FIG. 12A, the location of the rising edges of synthesized clock signal 171 are controlled by the rising edges of the delay signal selected by first multiplexer 145a, and the location of the falling edges of synthesized clock signal 171 are controlled by the rising edges of the delay signal selected by second multiplexer 145b. Flip-flop 169 is triggered by a rising edge of a delay signal at its clock input. Hence, each time a rising edge of the delay signal selected by first multiplexer 145a is passed to the output of third multiplexer 145c and reaches the clock input of flip-flop 169, it causes synthesized clock signal 171 to change state. Similarly, each time a rising edge of the delay signal selected by second multiplexer 145b is passed to the output of third multiplexer 145c and reaches the clock input of flip-flop 169, it causes synthesized clock signal 171 to change state.

Figure 12B:
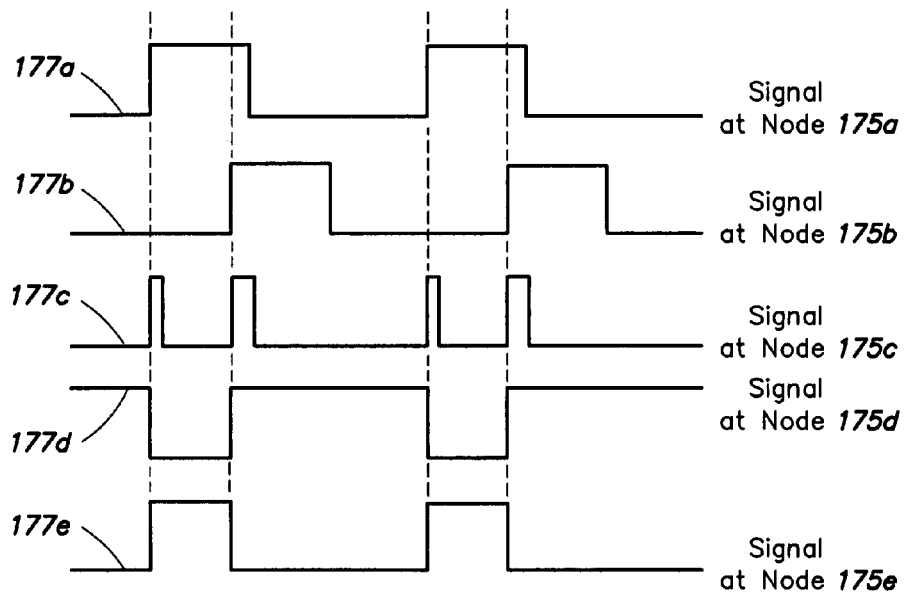
FIG. 12B illustrates a timing diagram for the programmable clock synthesizer of FIG. 12A for one combination of delay signals selected by the programmable clock synthesizer.

FIG. 12B illustrates the signals at nodes 175a-e for one combination of delay signals that may be output by first and second multiplexers 145a and 145b. Specifically, delay signal 177a represents the signal output by first multiplexer 145a at node 175a, and delay signal 177b represents the signal output by second multiplexer 145b at node 175b. Of course, it should be appreciated that delay signals 177a and 177b represent just one possible combination of delay signals that may be output by first and second multiplexers 145a and 145b and that many other delay signals and combinations thereof are possible. Signal 177c represents the signal output by the third multiplexer 145c at node 175c, and input to the clock input of flip-flop 169. As shown, signal 177c follows the signal at node 175b when the signal at node 175e is high, and follows the signal at node 175a when the signal at node 175e is low. Hence, when signal 177e is low, a rising edge in signal 177a will trigger a rising edge in signal 177c. This is shown in the fist rising edges of signals 177a and 177c of FIG. 12A. However, when signal 177e transitions to a high state, signal 177c will follow the signal 177b and become low, as shown after the first rising edge of signal 177c in FIG. 12B. Signal 177c exhibits a rising edge for each rising edge of signal 177a or 177b. As may be appreciated from FIG. 12B, signal 177e, which represents synthesized clock signal 171, exhibits a rising edge for each rising edge of signal 177a and a falling edge for each rising edge of signal 177b.

Although a single synthesized clock signal output is shown in FIG. 12A, it should be appreciated that the programmable clock synthesizer shown may be modified to include a plurality of synthesized clock signal outputs, such that different synthesized clock signals may be generated in parallel. In one example, the programmable clock synthesizer shown may be modified by including more than one of the circuit shown in FIG. 12A, each circuit being coupled to input bus 141 and generating a synthesized clock signal output.

In the embodiments illustrated in FIGS. 11-12, two delay signals may be selected from a plurality of delay signals to generate a synthesized clock signal. This allows for a high degree of flexibility in the generation of the synthesized clock signal. However, in some circumstances, it may be desirable to use preselected signals to generate a synthesized clock signal. For example, referring back to FIG. 3, it may be desirable to use timing signals SHP and SHD to generate a third timing signal, timing signal CLKCDS.

Figure 13A:
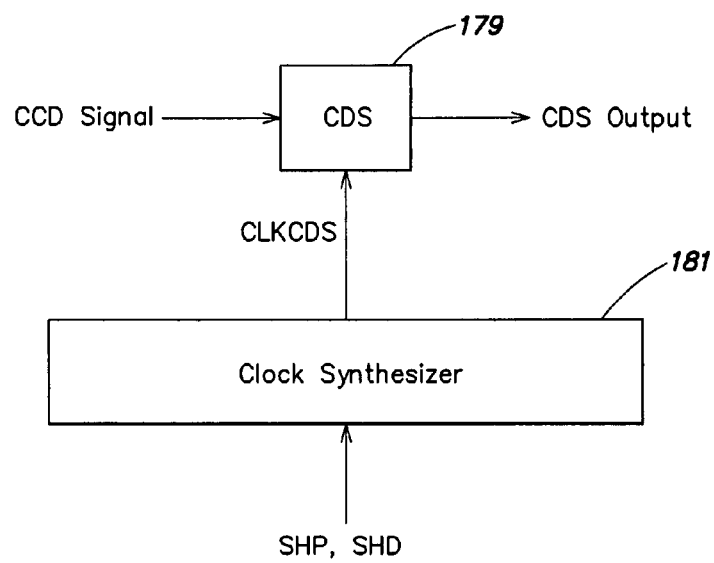
FIG. 13A illustrates a block diagram of the programmable clock synthesizer that provides a timing signal for a portion of a signal processing channel based on preselected delay signals.
Figure 13B:
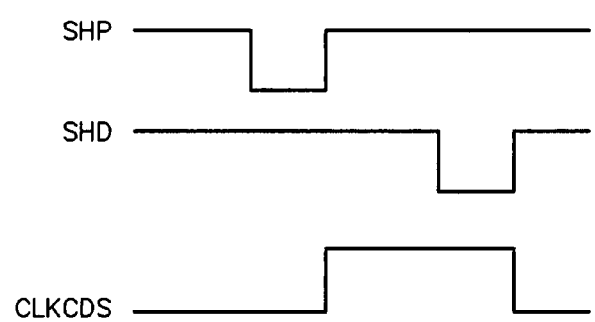
FIG. 13B illustrates exemplary input and output signals for the programmable clock synthesizer of FIG. 13A.
Figure 13C:
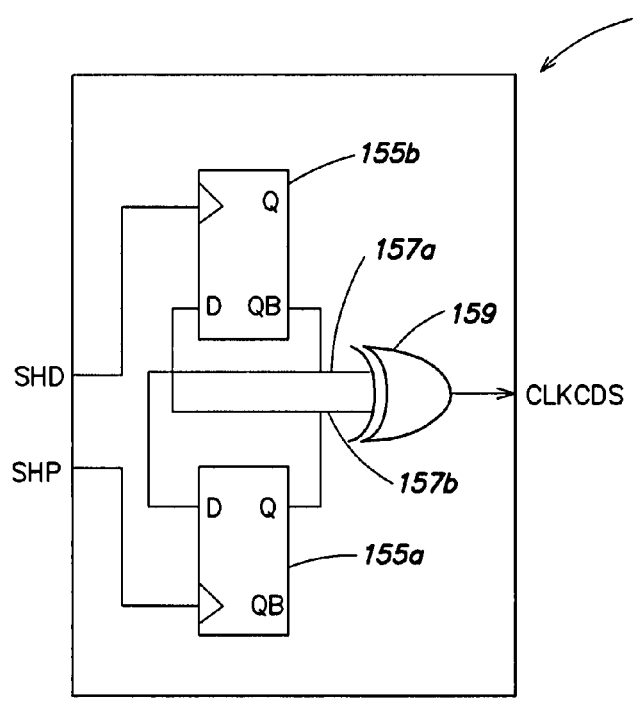
FIG. 13C illustrates a schematic representation of one implementation of the clock synthesizer of FIG. 13A.

FIGS. 13A-D illustrate one embodiment of a clock synthesizer that uses two input timing signals to generate a third output timing signal. To illustrate the operation of the clock synthesizer, FIGS. 13A-C show the input timing signals as timing signals SHP and SHD of FIG. 3, although any combination of input timing signals may be used. Output timing signal is shown as timing signal CLKCDS of FIG. 3, which may be input to CDS 179 of a CCD processing channel, such as the CCD processing channel shown in FIG. 3.

As shown in FIG. 13A, clock synthesizer 181 receives timing signals SHP and SHD as inputs. In one implementation of the clock synthesizer 181 of FIG. 13A, shown as clock synthesizer 183 in FIG. 13C, the clock synthesizer comprises first and second D-type flip-flops 155a and 155b and an exclusive or (XOR) gate 159. Timing signal SHP is input to the clock input of first flip-flop 155a, and timing signal SHD is input to the clock input of second flip-flop 155b. The D inputs of first and second flip-flops 155a and 155b are respectively coupled to second and first inputs 157a and 157b of XOR gate. In addition, the inverted output QB of second flip-flop 155b is coupled to the first input 157a of XOR gate 159, and the non-inverted output Q of first flip-flop 155a is coupled to the second input 157b of XOR gate 159. The output of XOR gate 159 is timing signal CLKCDS. The operation of first and second flip-flops 155b and 155a and XOR gate 159 is the same as described in connection with FIG. 11, and therefore will not be described.

It should be appreciated that XOR gate 159 may be substituted for equivalent logic circuitry, or another circuit that produces a positive output when the inputs are unequal. Further, programmable clock synthesizer 183 may be adapted to achieve a similar result using one or more other types of flip-flops, such as a falling edge-triggered flip-flops or J-K flip-flops.

Figure 13D:
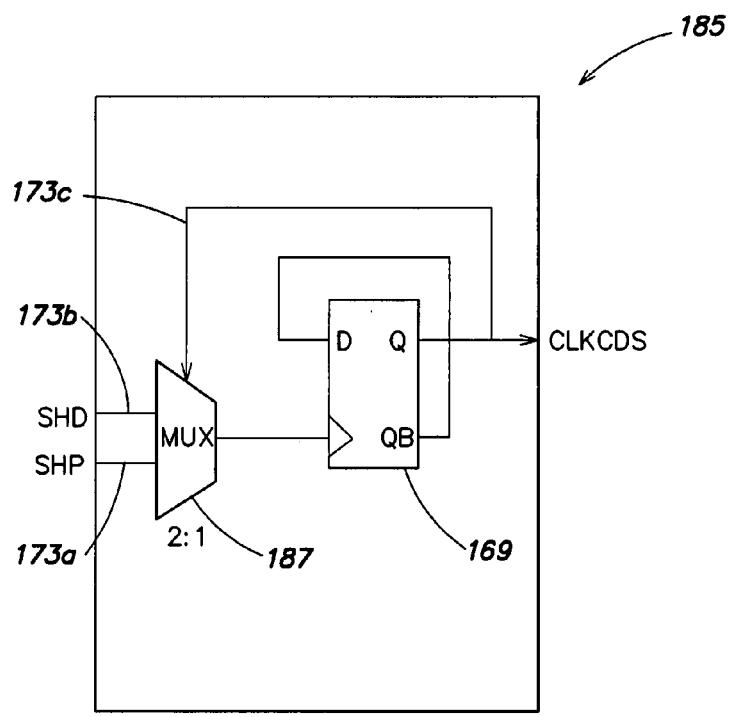
FIG. 13D illustrates a schematic representation of another implementation of the clock synthesizer of FIG. 13A.

In another implementation of the clock synthesizer 181 of FIG. 13A, shown as clock synthesizer 185 in FIG. 13D, the clock synthesizer comprises a multiplexer 187 and a flip-flop 169. Timing signals SHP and SHD are input to first and second inputs 173a and 173b of multiplexer 187. The output of multiplexer is coupled to the clock input of flip-flop 169. The non-inverted output Q of flip-flop 169 is coupled to a third input 173c of multiplexer 187 to provide control of the multiplexer. In particular, the state of the non-inverted output Q of flip-flop 169 controls which of timing signals SHD and SHP will be passed to the output of multiplexer 187 as timing signal CLKCDS. The operation of flip-flop 169 is the same as described in connection with FIG. 12A, and therefore will not be described.

As shown in FIG. 13D, timing signal SHP controls the rising edge of timing signal CLKCDS, and timing signal SHD controls the falling edge of timing signal CLKCDS. Specifically, a rising edge of timing signal SHP triggers a rising edge in timing signal CLKCDS and a rising edge of timing signal SHD triggers a falling edge in timing signal CLKCDS. Accordingly, a pulse is formed in timing signal CLKCDS for the period between a rising edge in timing signal SHP and the succeeding rising edge of timing signal SHD. If multiple rising edges exist in timing signals SHP and SHD, a pulse may formed in timing signal CLKCDS between each rising edge of timing signal SHP and each succeeding rising edge of clock signal SHD.

Having thus described several illustrative embodiments of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method, comprising acts of:
    initializing a feedback loop such that the feedback loop generates a desired delay by generating at least one predetermined initialization signal and transmitting the at least one predetermined initialization signal to the feedback loop;
    using the feedback loop, generating a plurality of delay signals;
    selecting from the plurality of delay signals a first delay signal and a second delay signal; and
    processing at least the first and second delay signals to generate a first timing signal.

2. The method of claim 1, wherein the act of processing includes processing the at the least first and second delay signals of the plurality of delay signals to generate the first timing signal for a signal processing channel.

3. The method of claim 1, further comprising an act of:
    processing at least two of the plurality of delay signals to generate a second timing signal.

4. The method of claim 3, wherein the act of processing at least two of the plurality of delay signals includes processing the at least two of the plurality of delay signals to generate the second timing signal for the signal processing channel.

5. The method of claim 1, wherein the act of generating a plurality of delay signals includes generating first, second, and third delay signals, each having a different phase.

6. The method of claim 5, wherein the act of generating a plurality of delay signals includes generating first, second, and third delay signals, each having substantially the same period.

7. The method of claim 5, wherein the act of generating a plurality of delay signals includes generating a first delay signal that has a first phase shift with respect to a reference signal, a second delay signal that has a second phase shift with respect to the reference signal that is approximately twice that of the first phase shift, and a third delay signal that has a third phase shift with respect to the reference signal that is approximately three times that of the first phase shift.

8. The method of claim 1, wherein the act of processing includes processing the at least the first and second delay signals to generate the first timing signal for a CCD signal processing channel.

9. The method of claim 1, wherein the act of generating the plurality of delay signals includes:
    inputting a reference clock signal to a plurality of delay elements connected in series; and
    outputting a signal at an output of each delay element of the plurality of delay elements, the signal at an output of each delay element representing a delay signal of the plurality of delay signals.

10. The method of claim 9, wherein the act of inputting includes inputting the reference clock signal to the plurality of delay elements having a total delay that is approximately equal to one period of the reference clock signal.

11. The method of claim 10, further comprising an act of:
    controlling the total delay of the plurality of delay elements using feedback.

12. The method of claim 11, wherein the act of controlling includes:
    comparing a phase of an output of the plurality of delay elements with a phase of the reference clock; and
    increasing or decreasing the total delay of the plurality of delay elements in response to the comparison.

13. The method of claim 12, wherein the act of increasing or decreasing includes increasing the total delay of the plurality of delay elements if the phase of the output of the plurality of delay elements is less than a phase of the reference clock, and decreasing the total delay of the plurality of delay elements if the phase of the output of the plurality of delay elements is greater than a phase of the reference clock.

14. The method of claim 12, further comprising acts of:
    generating voltage pulses in response to the comparison of the phase of the output of the plurality of delay elements with the phase of the reference clock;
    integrating the voltage pulses to generate a control signal;
    transmitting the control signal to the plurality of delay elements to increase or decrease the total delay of the plurality of delay elements.

15. The method of claim 9, wherein the act of inputting includes inputting a reference clock signal having a frequency that is less than or equal to a frequency of the first timing signal.

16. The method of claim 1, wherein one of the plurality of delay signals has a delay period that approximates one period of the master clock signal.

17. The method of claim 1, wherein the master clock has a frequency, and wherein the act of processing comprises processing at least the first and second delay signals to generate the first timing signal such that it has the same frequency as the master clock.

18. The method of claim 1, wherein the act of generating the plurality of delay signals includes inputting a reference clock signal to a plurality of delay elements connected in series; and outputting a signal at an output of each delay element of the plurality of delay elements, the signal at an output of each delay element representing a delay signal of the plurality of delay signals; and wherein the method further comprises acts of:
    comparing a phase of an output of the plurality of delay elements and a phase of the reference clock signal; and
    transmitting a control signal to the plurality of delay elements, wherein the control signal is based on a difference between the phase of the output of the plurality of delay elements and the phase of the reference clock signal;
    wherein the act of initializing comprises initializing a difference between the phase of the output of the plurality of delay elements and the phase of the reference clock signal to a known value.

19. The method of claim 1, wherein the act of generating the plurality of delay signals includes inputting a reference clock signal to a plurality of delay elements connected in series; and outputting a signal at an output of each delay element of the plurality of delay elements, the signal at an output of each delay element representing a delay signal of the plurality of delay signals; and wherein the method further comprises acts of:
    comparing a phase of an output of the plurality of delay elements and a phase of the reference clock signal; and transmitting a control signal to the plurality of delay elements, wherein the control signal is based on a difference between the phase of the output of the plurality of delay elements and the phase of the reference clock signal;

wherein the act of initializing comprises initializing the control signal to a known value corresponding to an approximate minimum delay or an approximate maximum delay of the plurality of delay elements.

20. The method of claim 1, wherein the act of generating the plurality of delay signals includes inputting a reference clock signal to a plurality of delay elements connected in series; and outputting a signal at an output of each delay element of the plurality of delay elements, the signal at an output of each delay element representing a delay signal of the plurality of delay signals; and wherein the method further comprises acts of:

comparing a phase of an output of the plurality of delay elements and a phase of the reference clock signal; and transmitting a control signal to the plurality of delay elements, wherein the control signal is based on a difference between the phase of the output of the plurality of delay elements and the phase of the reference clock signal;

wherein the act of initializing comprises initializing a state of the output of each delay element to a known value.

21. The method of claim 1, wherein the plurality of delay signals are each delayed by a respective delay period with respect to a master clock, wherein the delay periods of the respective delay signals terminate at a different respective times, and wherein the times are equally spaced and span one period of the master clock signal.

22. A timing signal generator to generate a plurality of timing signals, the timing signal generator comprising:

a delay signal generator comprising a feedback loop to generate a plurality of delay signals;

initialization circuitry adapted to generate and transmit at least one predetermined initialization signal to the feedback loop such that the feedback loop generates a desired delay;

selection circuitry for selecting from the plurality of delay signals at least a first delay signal and a second delay signal; and a clock synthesizer to generate the timing signals based on the selected ones of the delay signals.

23. The timing signal generator of claim 22, wherein each delay signal of the plurality of delay signals has substantially the same period.

24. The timing signal generator of claim 22, wherein the one or more timing signals are one or more timing signals for a signal processing channel.

25. The timing signal generator of claim 22, wherein the one or more timing signals are one or more timing signals for a CCD signal processing channel.

26. The timing signal generator of claim 22, wherein the delay signal generator further comprises:

a clock input to receive a reference clock signal;

a plurality of delay elements connected in series and coupled to the clock input; and a plurality of delay signal outputs, each coupled to a node at an output of one of the plurality of delay elements, to provide the delay signals.

27. The timing signal generator of claim 26, wherein each delay element of the plurality of delay element is constructed to delay an input signal by approximately the same phase.

28. The timing signal generator of claims 26, wherein the delay signal generator further comprises:

a plurality of delay element control lines, each coupled to a delay element to provide control information to the delay element to increase or decrease a delay of the delay element.

29. The timing signal generator of claim 28, wherein the plurality of delay elements has a total delay that is approximately equal to one period of the reference clock signal.

30. The timing signal generator of claim 29, further comprising:

a phase comparator to compare a phase of an output of the plurality of delay elements and a phase of the reference clock signal and output a control signal based on a difference between the phase of the output of the plurality of delay elements and the phase of the reference clock signal;

wherein the phase comparator is coupled to the plurality of delay element control lines.

31. The timing signal generator of claim 30, wherein the initialization circuitry is adapted to initialize the difference between the phase of the output of the plurality of delay elements and the phase of the reference clock signal to a known value.

32. The timing signal generator of claim 30, wherein the initialization circuitry is adapted to initialize the control signal to a known value corresponding to an approximate minimum delay or an approximate maximum delay of the plurality of delay elements.

33. The timing signal generator of claim 30, wherein the initialization circuitry is adapted to initialize a state of each of the plurality of delay signal outputs to a known value.

34. The timing signal generator of claim 30, further comprising:

a low pass filter, coupled between the phase comparator and the plurality of delay element control lines, to filter a higher frequency portion of the control signal.

35. The timing signal generator of claim 30, wherein the phase comparator is a phase frequency detector.

36. The timing signal generator of claim 26, wherein the reference clock signal has a frequency that is the same or less than a frequency of each of the timing signals.

37. The timing signal generator of claim 22, further comprising at least one external input, coupled to an external interface, to select one or more of the selected delay signals.

38. The timing signal generator of claim 37, wherein the at least one external input is coupled to a computer system.

39. The timing signal generator of claim 22, wherein one of the plurality of delay signals has a delay period that approximates one period of the master clock signal.

40. The timing signal generator of claim 22, wherein the master clock signal has a first frequency, the timing signals have a second frequency, and the first and second frequencies are the same.

41. The timing signal generator of claim 22, wherein the plurality of delay signals are each delayed by a respective delay period with respect to a master clock, wherein the delay periods of the respective delay signals terminate at a different respective times, and wherein the times are equally spaced and span one period of the master clock signal.

* * * * *